United States Patent [19]
Andrews, II et al.

[11] 4,021,836
[45] May 3, 1977

[54] INVERTED HETEROJUNCTION PHOTODIODE

[75] Inventors: Austin M. Andrews, II; John E. Clarke, both of Newbury Park; Edward R. Gertner; Joseph T. Longo, both of Thousand Oaks; Richard C. Eden, Newbury Park, all of Calif.

[73] Assignee: The United States of America as represented by the Secretary of the Air Force, Washington, D.C.

[22] Filed: Apr. 12, 1976

[21] Appl. No.: 566,159

[52] U.S. Cl. .................................. 357/30; 357/16; 357/61
[51] Int. Cl.² ................ H01L 27/14; H01L 29/161
[58] Field of Search .................... 357/30, 16, 61

[56] References Cited
UNITED STATES PATENTS

| | | | |
|---|---|---|---|
| 3,911,469 | 10/1975 | Wrobel | 357/30 |
| 3,961,998 | 6/1976 | Scharnhorst | 148/175 |

OTHER PUBLICATIONS

Walpole et al., *Solid State Electronics*, 1972, vol. 15, pp. 403–407.
Holloway et al., *Journal of Appl. Physics*, vol. 41, No. 8, July, 1970, pp. 3543–3545.
Walpole et al., *Appl. Phys. Lett.*, vol. 23, No. 11, Dec. 1, 1973, pp. 620–622.

*Primary Examiner*—Martin H. Edlow
*Attorney, Agent, or Firm*—Joseph E. Rusz; William J. O'Brien

[57] ABSTRACT

An inverted heterojunction photodiode for use as a laser detector sensitive to the 8 – 14 $\mu$m portion of the infrared spectrum and operable above 77° K. The diode structure comprises a PbTe substrate, a first buffer layer of a $Pb_{.90}Sn_{.10}Te$ material on said substrate and a second active layer of a $Pb_{.80}Sn_{.20}Te$ material on said buffer layer. The first and second layers are grown by liquid phase epitaxy.

1 Claim, 3 Drawing Figures

INVERTED HETEROJUNCTION PHOTODIODE

STATEMENT OF GOVERNMENT INTEREST

The invention described herein may be manufactured and used by or for the Government for governmental purposes without the payment of any royalty thereon.

BACKGROUND OF THE INVENTION

This invention relates to a heterojunction photodiode. More particularly, this invention relates to a PbSnTe photodiode detector for 10.6 $\mu$m heterodyne applications.

At the present time, carbon dioxide laser radar, illuminator and communication systems often utilize low temperature extrinsic detectors as a 10.6 $\mu$m receiver. However, in most instances, extrinsic detectors do not possess the requisite sensitivity and wide IF bandwidth necessary for modern applications. Furthermore, even in those situations where an extrinsic detector achieves a usable sensitivity and speed, problems are encountered because they require cooling temperatures of between 4° and 30° K.

In accordance with this invention, however, it has been found that the aforementioned problems can be overcome by utilizing an intrinsic detector. An intrinsic detector of PbSnTe offers a higher temperature of operation as well as an energy band gap tunable to the 10.6 $\mu$m range. The low operating temperature required for extrinsic detectors eliminates them for most military systems. However, the reverse biased $Pb_{1-x}Sn_xTe$ photodiode of this invention fulfills the present need for 77° K 10.6 $\mu$m detectors which are sensitive, fast, have uniform response, and are reliable.

SUMMARY OF THE INVENTION

In accordance with this invention, it has been discovered that liquid phase epitaxial $Pb_{1-x}Sn_xTe$, wherein $x$ is an integer of from about 0.10 to 0.20, provides a material capable of meeting many of the requirements for high performance 10.6 $\mu$m photodiodes. The photodiodes fabricated from this material exhibit excellent characteristics and are especially useful for present $CO_2$ laser radar and communication systems. The photodiode fabricated according to this invention is a high sensitivity 10.6 $\mu$m heterodyne receiver having a wide IF band width while operating near liquid nitrogen temperatures of 77° K. The high sensitivity demonstrated by the photodiodes increases the ranging power of the $CO_2$ laser and the wide IF bandwidth increases the radar tracking ability and the communication capability.

In general, the photodiode of this invention is a three layered inverted heterostructure. The basic configuration comprises a transparent PbTe substrate with a transparent buffer layer of $Pb_{.90}Sn_{.10}Te$ formed thereon. An absorbing P-i-n $Pb_{.80}Sn_{.20}Te$ active layer is formed on the buffer layer resulting in a three tiered device. The advantages resulting from the unique structural arrangement of the photodiode are twofold. First, with light incident through the substrate, the entire area of a mesa type configuration can be contacted to reduce the series resistance and simplify contacting of a two dimensional pattern. Secondly, the entire dead area under the contact of a "normal mesa" can be eliminated, thus improving the response time by lowering the capacitance.

The high performance characteristics of the photodiode of this invention apparently can be attributed to the fact that the $Pb_{1-x}Sn_xTe$ material is grown by liquid phase epitaxy, a conventional process well known in the art. The material possesses a low carrier concentration, a uniform Pb-Sn ratio, and multilayer heterostructures which give the photodiode its desirable performance characteristics of high speed, high quantum efficiency, low capacitance and low leakage.

Accordingly, the primary object of this invention is to provide a novel inverted heterojunction photodiode.

Another object of this invention is to provide a PbSnTe heterojunction photodiode which is sensitive to the 8 – 14 $\mu$m portion of the infrared spectrum and operable above 77° K.

Still another object of this invention is to provide a three-tiered photodiode fabricated from a PbSnTe material grown by a liquid phase epitaxy process.

A further object of this invention is to provide a high temperature 10.6 $\mu$m heterodyne receiver for carbon dioxide laser applications.

Another further object of this invention is to provide a heterojunction photodiode detector fabricated from an intrinsic semiconductor material.

Still a further object of this invention is to provide a photodiode detector for 10.6 $\mu$m heterodyne applications that is capable of achieving high speed high, quantum efficiency, low capacitance and low leakage.

The above and still further objects and advantages of this invention will become more readily apparent upon consideration of the following detailed description thereof when taken in conjunction with the accompanying drawings.

DESCRIPTION OF THE DRAWINGS

In all the figures, similar elements are represented by similar numerals.

DESCRIPTION OF THE PREFERRED EMBODIMENT

Pursuant to the above defined objects, the present invention provides an inverted heterojunction photodiode operable at temperatures about 77° K as a 10.6 $\mu$m receiver for carbon dioxide laser applications. The photodiode is fabricated from an intrinsic semiconductor material having the formula $Pb_{1-x}Sn_xTe$ wherein $x$ is an integer of from about 0.10 to 0.20. The basic configuration of the photodiode is three tiered and comprises a transparent substrate composed of PbTe having either a p-type (electrons) or n-type (holes) conductivity. A first layer of a transparent $Pb_{.90}Sn_{.10}Te$ P-type or n-type material is coated onto the substrate to provide a buffer between the substrate and a second active layer. The second active layer is deposited upon the first buffer layer and is composed of a $Pb_{.80}Sn_{.20}Te$ material having either n-type or p-type conductivity. The first and second layers are epitaxial since it was found that both the high speed and high sensitivity of the device of this invention can be attributed to the use of a liquid phase epitaxial growth process as the means of obtaining the PhSnTe photodiode of this invention.

Figure 1:
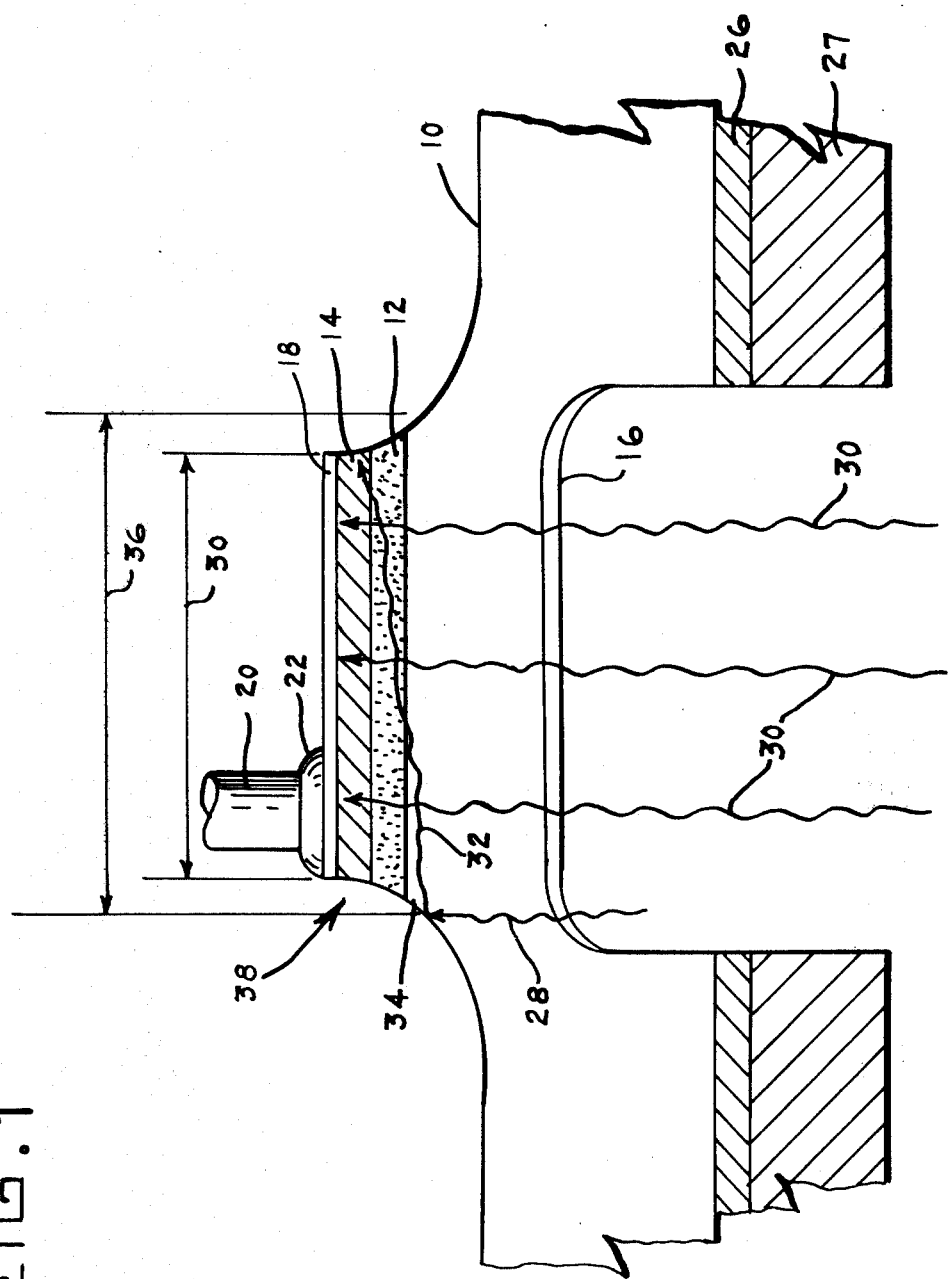
FIG. 1 sets forth in schematic form an illustrative embodiment of the photodiode of this invention, while FIGS. 2 and 3 set forth in schematic form illustrations which point out the advantages of the present invention.

In order to more particularly describe the invention, reference is now made to FIG. 1 of the drawing which illustrates a mesa type structure of a single element PbSnTe inverted heterostructure photodiode made according to the invention. The device consists of an n-type PbTe substrate 10 that has a low carrier concentration ($\sim 10^{17}$ cm$^{-3}$) to minimize free carrier absorption at 10.6 $\mu$m. On the PbTe substrate 10 is grown by liquid phase epitaxy a 10.6 $\mu$m transparent n-type layer 12 of Pb$_{0.9}$Sn$_{0.1}$Te. In present devices this carrier concentration is near $10^{17}$ cm$^{-3}$ but for wide bandwidth (>1 gigahertz) a carrier concentration near $10^{14}$ cm$^{-3}$ is needed. Following the layer 12 is grown a Pb$_{0.8}$Sn$_{0.2}$Te epitaxial active layer 14 with large 10.6 $\mu$m absorption. This layer does not have carrier concentrations much greater than $10^{17}$ cm$^{-3}$. The PbTe substrate region 10 under the optically sensitive area is reduced in thickness to minimize the free carrier absorption of the incident beam. A ZnS film 16 is deposited on the PbTe surface 10 as a quarter-wave coating to reduce the 50 percent reflection at the PbTe-air interface. A metallized region 18 composed of either nickel, chromium or platinium is deposited on the surface of the mesa top defined by layer 14 to provide a very low resistance ohmic contact to the active layer 14. A gold wire 20 is affixed to the metallized region 18 by means of a conductive epoxy solder 22 as a lead attachment. The photodiode is attached to a copper base 24, such as a threaded copper screw, by means of an indium alloy solder 26 to provide a means for attaching the photodiode to a laser device.

With the photodiode of this invention, the incident radiation represented by wavy arrows 30 contributes to a signal in two ways. First, by direct absorption in the Pb$_{.80}$S$_{.20}$Te layer under the electrical area defined by the arrow 30, and secondly by internal reflections, as indicated at 32, at the mesa slopes 34, when the angle of incidence is greater than 45° to the absorbing region. Optical gain as high as thirty has been achieved with this device. The optical gain is defined as the ratio of the quantum efficiencies for an unfocused beam and a focused beam incident on the detector, or as a ratio of the optically sensitive area (represented by the arrow 36) to the electrical junction area 30.

A spectral response of the photodiode of this invention of between 8 and 11.5 $\mu$m is due to absorption of the photons in the p-Pb$_{0.8}$Sn$_{.2}$Te material and is the response of major importance. The response between 6 and 8 $\mu$m is due to absorption of photons in the Pb$_{0.9}$Sn$_{.1}$Te layer and the diffusion of generated carriers to the p-n junction. This diffusion of carrier acts to lower signal over this wavelength range. The drop in signal below 6 $\mu$m is due to photon absorption in the PbSnTe material. Carriers generated here either are not within a diffusion length of the p-n junction or there is considerable surface recombination at the PbSnTe interface to eliminate most generated carriers.

Figure 2:
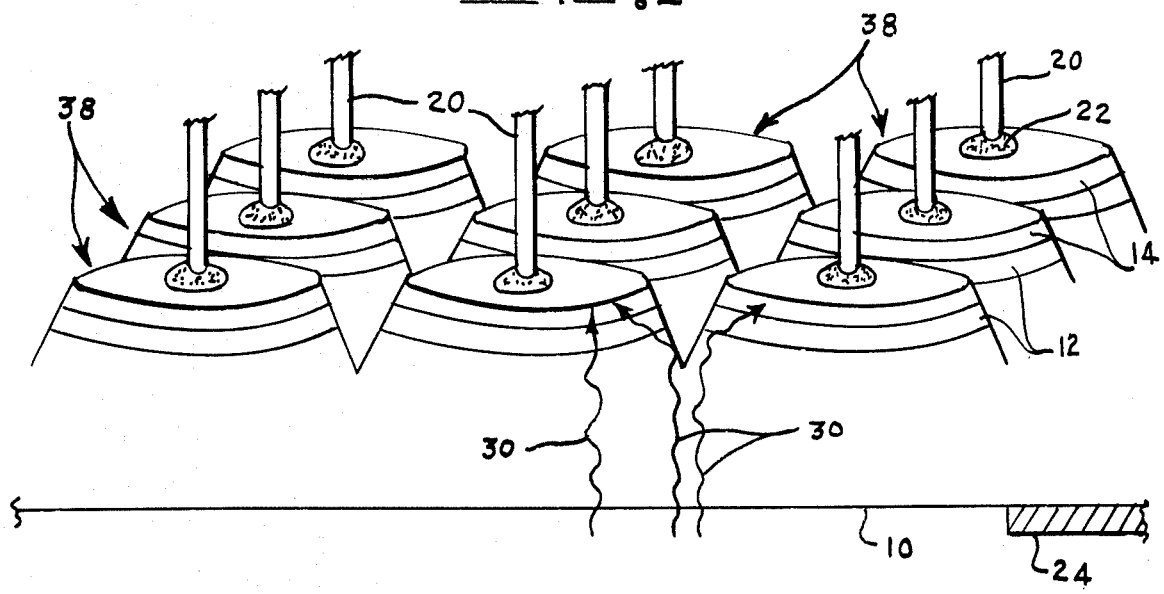

The inverted PbTe-PbSnTe heterojunction detector of this invention satisfies the requirements of high speed, high quantum efficiency and mosaic technology. In the device design shown in FIG. 2, which represents a plurality of mesa tops, Co$_2$ laser radiation 30 is incident on the PbTe substrate 10 which is transparent to wavelengths beyond 6 $\mu$m because free carrier absorption is kept to a minimum by using low carrier concentration substrates 10, N<3×10$^{17}$ cm$^{-3}$ either n or p type. The radiation 30 also passes through the PbSnTe buffer layer 12 since the Pb-Sn composition is selected so that no band-to-band absorption occurs at the wavelength selected. This layer also provides a buffer which reduces the lattice mismatch at the critical interface between a non-absorbing and absorbing active layer 14. The PbSn ratio of the active layer is selected to give very strong band-to-band absorption of the radiation. The carrier type of the region 14 is opposite to that of the substrate 10 and buffer layer 12. Thus, if this layer is p-type (n-type), electrons (holes) created by the absorption of the radiation in the active layer move across the depletion region between the n and p type materials and are collected thereby creating a current in the external leads via contacts 24,22 and 20.

Figure 3:
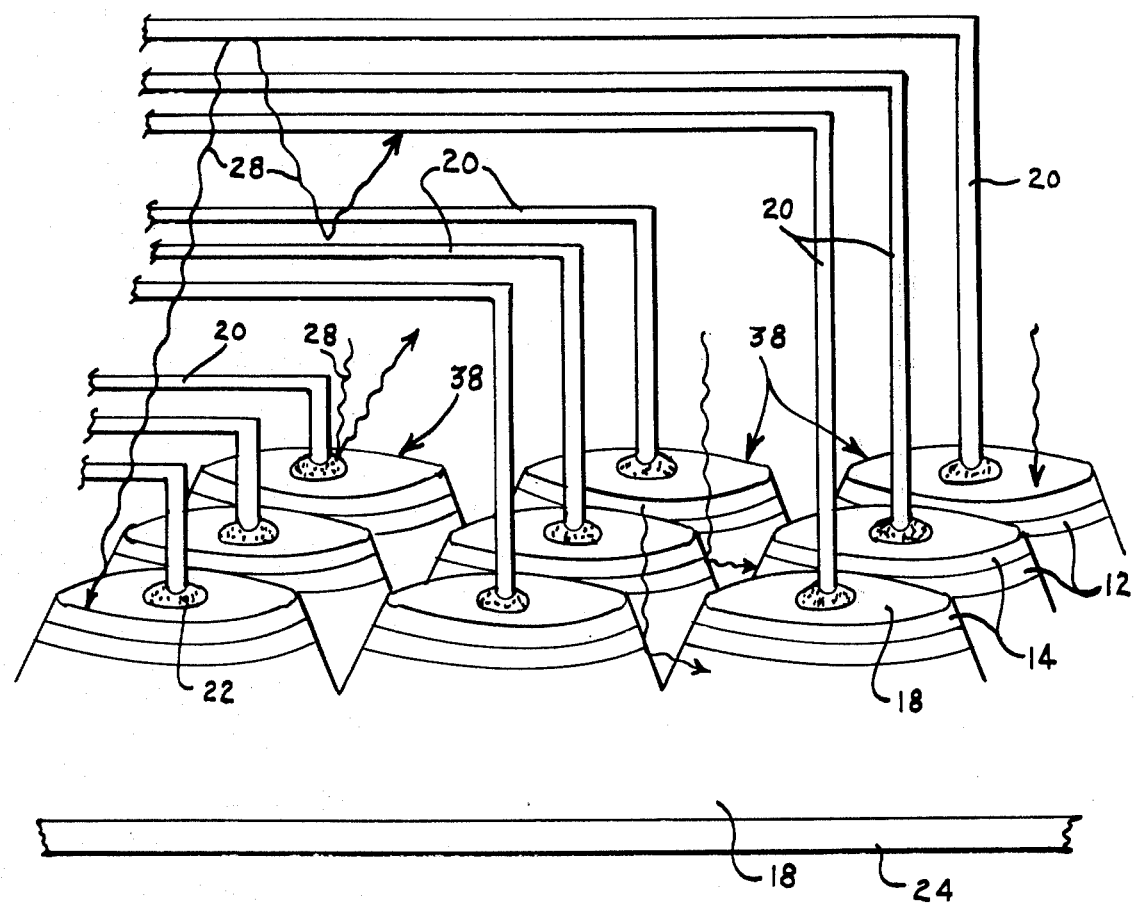

The advantages of the inverted structure over the normal device can best be explained by referring to FIG. 3. A good portion of the light 28 is reflected off the surface 18 the probes 20 or the contacts 22 to the mesa tops 38 which is a loss in the total incoming radiation. This is not a problem with the inverted heterostructure since all of the incoming radiation 30 under the mesa area is collected. Also, radiation which impinges on the sides of the mesas 38 is either reflected back or absorbed in the substrate 10, due to the fact that the index of refraction of PbSnTe is so much larger than that of air. This works to the advantage of the inverted heterostructure of FIG. 2, however, because light is reflected off the mesa sides into the active region 14. Thus, a larger percentage of the available light is obtained with the inverted heterostructure device configuration of FIGS. 1 and 2.

Often a more serious problem is that some of the light is scattered from its proper path and collected by the wrong detector giving rise to crosstalk. This scattering takes place both from off the probes and from the side of one mesa into the active region of another. Notice again that this does not occur for the inverted heterostructure. For this normal structure the substrate is a wafer cut from a vapor grown boule of P$^+$ — Pb$_{.80}$Sn$_{.20}$Te the wafer is used as the seed and supporting material for the epitaxially grown layers 12 and 14.

The epitaxial layers 12 and 14 are grown in a single process that lasts typically six hours from insertion of the substrate into a conventional growth apparatus to removal of the finished chip. The basic procedure is documented in the open literature by two articles "Low Carrier Concentration Liquid Epitaxial Pb$_{1-x}$Sn$_x$Te", J. T. Longo, E. R. Gertner, and A. S. Joseph, Applied Physics Letters, Vol. 19, No. 6, p. 202–203, and "Improved Surface Properties of Solution Grown GaAs and Pb$_{1-x}$Sn$_x$Te: A New Technique," J. T. Longo, J. S. Harris, Jr., E. R. Gertner, and J. C. Chue, J. of Crystal Growth (15) p. 107–116.

Briefly, a N$_2$ gas stream is used to provide a temperature gradient at the growth interface so that constitutional supercooling can be prevented. The temperature gradients required are large, $\cong$ 10° C/cm at the growth interface. Such gradients are achieved by the use of an appropriate apparatus. The substrate is oriented along <100> to force the nucleation pattern to be a two-dimensional cluster of nine atoms. Growth proceeds preferentially along the edges of each cluster rather than on top of it. The result is mirror-like growth features. The profile of a double layer structure indicates that the layers are uniformly thick. Single layer homojunction crossovers are similar in appearance but the p-n junction itself cannot be observed. The ability to simply measure the junction depth is a very time saving feature of the PbTePb$_{1-x}$Sn$_x$Te heterojunction over homojunctions however produced.

Lattice parameter measurements have been performed on the active layer to determine the homogeneity of the material as well as the Pb/Sn ratio. Using a Mo target the $K_1$ and $K_2$ peaks are so well resolved that the lattice parameter can be easily measured to 1 part in $10^4$. This corresponds to a variation of less than .1 percent in the Sn composition.

The scanning electron microscope has also been used in the x-ray mode to analyze the dependence of Pb/Sn ratio on position near the heterojunction. The results indicate that the Sn composition changes very rapidly from 20 percent to $\cong$ 0 percent. This data confirms the measurement of the heterojunction depth by an optical microscope, and indicates that diodes fabricated from such layers have excellent spectral uniformity. This excellent uniformity in Pb-Sn ratio can be attributed to a very weak dependence of the solid Pb-Sn ratio on either the growth temperature or the Pb-Sn ratio in solution for $X \cong .20$.

The heterojunction photodiodes of this invention are sensitive to the 8–14$\mu$ portion of the IR spectrum and operable above 77° K.

In summary, it has been found that liquid phase epitaxial $Pb_{1-x}Sn_xTe$ is a material capable of meeting many of the requirements for high performance 10.6 $\mu$m photodiodes. Photodiodes fabricated from this material have excellent characteristics. In the device structure of this invention, the incident radiation enters through a transparent substrate, and is absorbed in the active region beneath the p-n junction interface. Such a design has a two-fold advantage; First, it allows for the complete metallization of the top layer, so contacting is relatively straight-forward and secondly, it eliminates the "dead" area under the contacts of prior art devices, thus increasing the sensitivity of detectors of the same total area. Also, for the same active area, the inverted heterostructure has a wider bandwidth since it has a smaller capacitance.

While the principle of the present invention has been described with particularity, it should be understood that various alterations and modifications can be made without departing from the spirit of the invention, the scope of which is defined by the appended claims.

What is claimed is:

1. An inverted heterojunction photodiode particularly adapted to operate as a detector for 10.6 $\mu$m laser applications comprising (A) a transparent substrate composed of a PbTe mixed crystalline material; (B) a first epitaxially grown buffer layer of a $Pb_{.90}Sn_{.10}Te$ crystalline material interdisposed between said substrate; and (C) a second epitaxially grown active layer of a $Pb_{.80}Sn_{.20}Te$ crystalline material.

* * * * *